United States Patent
Mitsuya (10) Patent No.: US 9,112,173 B2
(45) Date of Patent: *Aug. 18, 2015

(54) LIGHT-EMITTING DEVICE, LIGHT-EMITTING APPARATUS, DISPLAY DEVICE AND ELECTRONIC APPARATUS

(75) Inventor: Masayuki Mitsuya, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 53 days.

This patent is subject to a terminal disclaimer.

(21) Appl. No.: 13/409,777

(22) Filed: Mar. 1, 2012

(65) Prior Publication Data

US 2012/0228648 A1    Sep. 13, 2012

(30) Foreign Application Priority Data

Mar. 9, 2011   (JP) .................. 2011-052126

(51) Int. Cl.
| | | |
|---|---|---|
| *H01L 29/18* | (2006.01) | |
| *H01L 51/50* | (2006.01) | |
| *H01L 27/32* | (2006.01) | |
| *H01L 51/00* | (2006.01) | |

(52) U.S. Cl.
CPC ........... *H01L 51/5044* (2013.01); *H01L 27/322* (2013.01); *H01L 51/0059* (2013.01); *H01L 51/0072* (2013.01); *H01L 51/0085* (2013.01); *H01L 2251/5376* (2013.01); *H01L 2251/552* (2013.01)

(58) Field of Classification Search
CPC .............. H01L 51/5044; H01L 27/322; H01L 2251/5376; H01L 51/0085; H01L 51/0059; H01L 51/0072; H01L 2251/552; H01L 33/50

USPC ........... 257/88, 40, 94, 103, 102, 98, E51.01, 257/E51.02; 313/504, 506; 428/490; 544/225; 136/263

See application file for complete search history.

(56) References Cited

U.S. PATENT DOCUMENTS

| | | | |
|---|---|---|---|
| 6,614,175 B2* | 9/2003 | Aziz et al. ..................... 313/504 |
| 7,504,657 B2* | 3/2009 | Suzuri et al. .................... 257/40 |
| 8,420,228 B2* | 4/2013 | Park et al. ...................... 428/690 |
| 2005/0248267 A1* | 11/2005 | Gyoutoku et al. ............ 313/506 |
| 2006/0125380 A1 | 6/2006 | Nagara et al. | |
| 2006/0158104 A1 | 7/2006 | Iijima et al. | |
| 2006/0261731 A1* | 11/2006 | Aziz et al. ..................... 313/504 |
| 2006/0289882 A1 | 12/2006 | Nishimura et al. | |
| 2007/0020485 A1* | 1/2007 | Kita et al. ...................... 428/690 |
| 2007/0090753 A1 | 4/2007 | Arakane | |

(Continued)

FOREIGN PATENT DOCUMENTS

| JP | A-2004-227814 | 8/2004 |
|---|---|---|
| JP | A-2006-049395 | 2/2006 |

(Continued)

*Primary Examiner* — Mohammed Shamsuzzaman
(74) *Attorney, Agent, or Firm* — Oliff PLC (57) ABSTRACT

A light-emitting device includes an anode, a cathode, a first phosphorescent layer and a fluorescent layer that are provided between the anode and the cathode and emit phosphorescent light and fluorescent light, respectively, upon energization of the anode and the cathode, and an intermediate layer provided between the first phosphorescent layer and the fluorescent layer, the intermediate layer including a hole transport layer and an electron transport layer that are in contact with each other, the electron transport layer being located on the anode side, the hole transport layer being located on the cathode side.

11 Claims, 5 Drawing Sheets

(56) References Cited

U.S. PATENT DOCUMENTS

| | | | |
|---|---|---|---|
| 2007/0241676 A1* | 10/2007 | Park et al. | 313/506 |
| 2008/0203406 A1* | 8/2008 | He et al. | 257/94 |
| 2008/0268282 A1* | 10/2008 | Spindler et al. | 428/690 |
| 2009/0001885 A1* | 1/2009 | Spindler et al. | 313/506 |
| 2009/0026934 A1* | 1/2009 | Fujita et al. | 313/504 |
| 2009/0091250 A1* | 4/2009 | Yasukawa et al. | 313/504 |
| 2010/0044689 A1* | 2/2010 | Nishimura et al. | 257/40 |
| 2010/0200848 A1 | 8/2010 | Arakane et al. | |
| 2010/0301317 A1 | 12/2010 | Nowatari et al. | |
| 2011/0105637 A1* | 5/2011 | Fujita et al. | 522/120 |
| 2012/0153324 A1* | 6/2012 | Lin et al. | 257/98 |
| 2012/0228589 A1* | 9/2012 | Mitsuya | 257/40 |
| 2012/0241889 A1* | 9/2012 | Takemura et al. | 257/431 |
| 2012/0248424 A1 | 10/2012 | Sasaki | |
| 2013/0048973 A1* | 2/2013 | Vaufrey et al. | 257/40 |
| 2013/0306949 A1 | 11/2013 | Nowatari et al. | |
| 2014/0151648 A1* | 6/2014 | Kido | 257/40 |

FOREIGN PATENT DOCUMENTS

| | | |
|---|---|---|
| JP | A-2006-049396 | 2/2006 |
| JP | 2006-172763 A | 6/2006 |
| JP | A-2006-172762 | 6/2006 |
| JP | A-2007-059848 | 3/2007 |
| JP | 2009-117310 A | 5/2009 |
| JP | A-2011-009199 | 1/2011 |
| JP | 2011-070963 A | 4/2011 |
| WO | 2005/112518 A1 | 11/2005 |
| WO | WO 2008/123178 A1 | 10/2008 |

\* cited by examiner

LIGHT-EMITTING DEVICE, LIGHT-EMITTING APPARATUS, DISPLAY DEVICE AND ELECTRONIC APPARATUS

BACKGROUND

1. Technical Field

The present invention relates to light-emitting devices, light-emitting apparatuses, display devices and electronic apparatuses.

2. Related Art

Organic electroluminescent devices (organic EL devices) are light-emitting devices having at least one luminescent organic layer interposed between an anode and a cathode. In this type of light-emitting device, electrons and holes are injected from the cathode side and the anode side, respectively, into the luminescent layer upon application of an electric field between the cathode and the anode. The electrons and the holes recombine within the luminescent layer to form excitons. The excitons then return to the ground state, releasing energy in the form of light.

Light-emitting devices which have two or more luminescent layers including a phosphorescent layer and a fluorescent layer between a cathode and an anode are known in the art.

In the case where such a light-emitting device is configured such that the phosphorescent layer and the fluorescent layer are stacked in contact with each other, the triplet energy of the phosphorescent layer is transferred toward the fluorescent layer and is thereafter deactivated without contributing to light emission, resulting in insufficient luminous efficiency.

In order to prevent or suppress the triplet energy transfer, it has been proposed that the phosphorescent layer and the fluorescent layer sandwich a single intermediate layer that contains both an electron transport material and a hole transport material, or an intermediate layer that satisfies a relation in terms of triplet energy with the phosphorescent layer and the fluorescent layer (see, for example, JP-A-2006-172762 and International Publication No. 2008/123178.

However, the provision of such an intermediate layer results in problems that the drive voltage of the light-emitting device is increased and that one of the phosphorescent layer and the fluorescent layer does not become luminous efficiently.

SUMMARY

An advantage of some aspects of the invention is that light-emitting devices are provided in which a phosphorescent layer and a fluorescent layer can emit phosphorescent light and fluorescent light efficiently even at a low drive voltage. Another advantage of some aspects of the invention is that light-emitting apparatuses, display devices and electronic apparatuses that have the light-emitting device are provided.

These and other advantages are achieved by some aspects of the invention described below.

A light-emitting device according to an aspect of the invention includes an anode; a cathode; a phosphorescent layer and a fluorescent layer that are provided between the anode and the cathode and emit phosphorescent light and fluorescent light, respectively, upon energization of the electrodes; and an intermediate layer provided between the phosphorescent layer and the fluorescent layer; the intermediate layer including a hole transport layer and an electron transport layer that are in contact with each other, the electron transport layer being located on the anode side, the hole transport layer being located on the cathode side.

According to the light-emitting device of this aspect of the invention, the phosphorescent layer and the fluorescent layer can emit phosphorescent light and fluorescent light, respectively, with good efficiency even when the device is driven at a low voltage.

In accordance with an embodiment of the light-emitting device, it is preferable that the phosphorescent layer be located between the anode and the intermediate layer, and the fluorescent layer be located between the cathode and the intermediate layer.

In order to collect efficiently the light emitted from each of the light-emitting layers, it is necessary to adjust the light path length. That is, the efficiency in collecting the light can be improved by locating a layer emitting a shorter wavelength light on the cathode side and a layer emitting a longer wavelength light on the anode side. Of luminous materials emitting short wavelength (in particular, blue) light, materials that emit fluorescent light generally surpass phosphorescent materials in terms of luminous color, luminous efficiency and life. Thus, locating the fluorescent layer and the phosphorescent layer in the above manner ensures that these light-emitting layers emit light more reliably and the emitted lights can be collected with improved efficiency.

In accordance with an embodiment of the light-emitting device, it is preferable that the triplet energies of both the hole transport layer and the electron transport layer be larger than the triplet energy of the phosphorescent layer.

This configuration can reliably suppress or prevent the triplet energy of the phosphorescent layer from being transferred toward the fluorescent layer side and being deactivated without contributing to light emission. Thus, the light-emitting device achieves particularly excellent luminous efficiency.

In accordance with an embodiment of the light-emitting device, it is preferable that the hole transport layer have an average thickness of not less than 2 nm and not more than 10 nm.

This configuration reliably ensures that the holes injected from the electron transport layer side can be transported toward the fluorescent layer side without a decrease in transport efficiency, as well as that the electrons can be injected from the fluorescent layer into the electron transport layer through the hole transport layer utilizing the tunnel effect while reliably preventing a decrease in injection efficiency.

In accordance with an embodiment of the light-emitting device, it is preferable that the electron transport layer have an average thickness of not less than 2 nm and not more than 10 nm.

This configuration reliably ensures that the electrons injected from the hole transport layer side can be transported toward the phosphorescent layer side without a decrease in transport efficiency, as well as that the holes can be injected from the phosphorescent layer into the electron transport layer through the electron transport layer utilizing the tunnel effect while reliably preventing a decrease in injection efficiency.

In accordance with an embodiment of the light-emitting device, it is preferable that the total of the thickness of the hole transport layer and that of the electron transport layer be not more than 15 nm.

This configuration can more reliably prevent an increase in the drive voltage of the light-emitting device and can ensure that the phosphorescent layer and the fluorescent layer emit light with good efficiency.

In accordance with an embodiment of the light-emitting device, it is preferable that the light-emitting device have a second phosphorescent layer that is provided between the anode and the phosphorescent layer and emits phosphorescent light upon energization between the anode and the cathode.

According to the above configuration, the first phosphorescent layer, the second phosphorescent layer and the fluorescent layer can be luminous in a well balanced manner. For example, the light-emitting device can emit white light by configuring these light-emitting layers so as to emit red, green and blue lights.

A light-emitting apparatus according to an aspect of the invention includes the light-emitting device described in any of the above embodiments.

With this configuration, an increase in the drive voltage of the light-emitting apparatus can be suppressed even when the apparatus is driven at a constant current for a long time.

A display device according to an aspect of the invention includes the light-emitting apparatus.

Thus, the display device can be driven stably and has excellent reliability.

An electronic apparatus according to an aspect of the invention includes the display device.

Thus, the electronic apparatus has excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
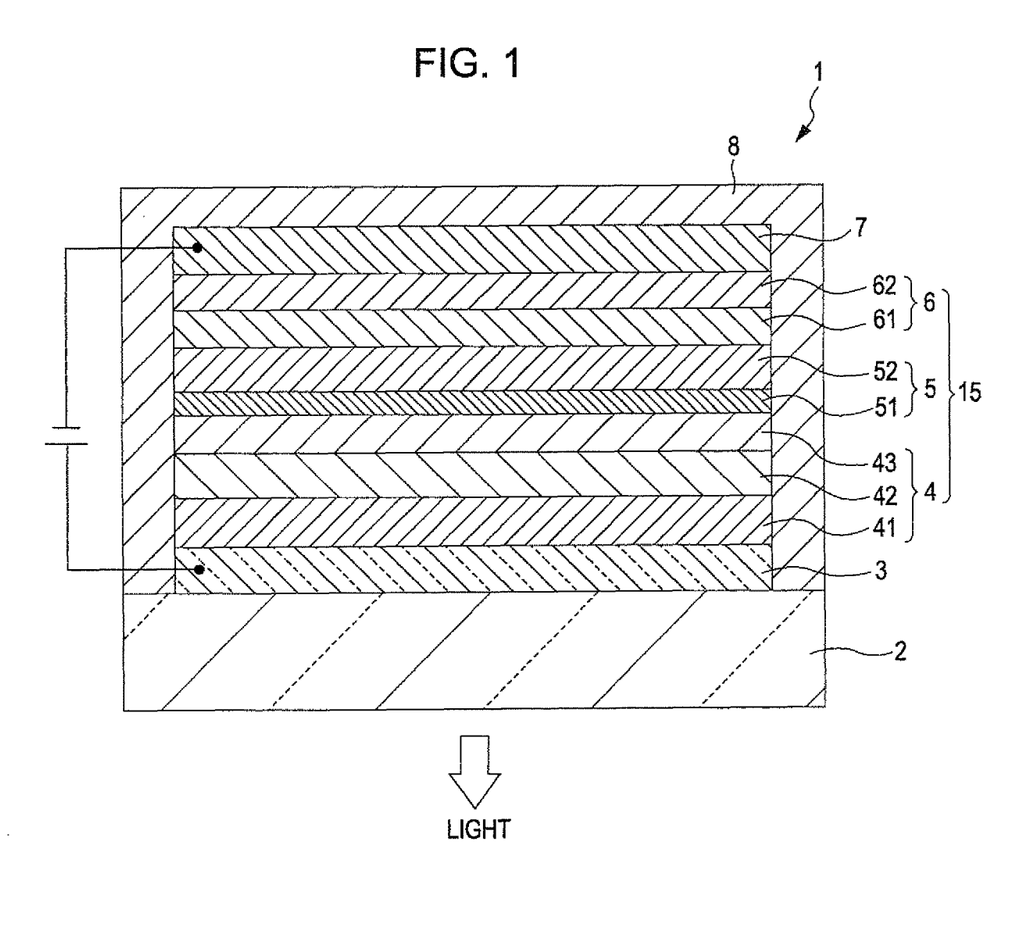
FIG. 1 is a view that schematically illustrates a vertical cross section of a light-emitting device according to a preferred embodiment of the invention.

Hereinbelow, embodiments of light-emitting devices, light-emitting apparatuses, display devices, and electronic apparatuses according to some aspects of the invention will be described with reference to the accompanying drawings.
Light-Emitting Devices FIG. 1 is a view that schematically illustrates a vertical cross section of a light-emitting device according to a preferred embodiment of the invention. For convenience in the following description, the upward direction and the downward direction in FIG. 1 will be defined to indicate upside and downside, respectively.

A light-emitting device (an electroluminescent device) 1 includes an anode 3, a first emitting section (a first emitting unit) 4, an intermediate layer 5, a second emitting section (a second emitting unit) 6 and a cathode 7 that are stacked on top of one another in this order.

In other words, the light-emitting device 1 has a multilayer structure 15 in which the first emitting section 4, the intermediate layer 5 and the second emitting section 6 are stacked in this order, and the multilayer structure 15 is sandwiched between the two electrodes (the anode 3 and the cathode 7).

The first emitting section 4 is a multilayer structure in which a hole transport layer 41, a second phosphorescent layer (a phosphorescent emitting layer) 42 and a first phosphorescent layer 43 are stacked in this order from the anode 3 side toward the cathode 7 side. The second emitting section 6 is a multilayer structure in which a fluorescent layer 61 and an electron transport layer 62 are stacked in this order from the anode 3 side toward the cathode 7 side.

The entirety of the light-emitting device 1 is provided on a substrate 2 and is sealed by a sealing member 8.

In the light-emitting device 1, holes are supplied (injected) from the anode 3 and electrons are supplied (injected) from the cathode 7 when a drive voltage is applied between the anode 3 and the cathode 7. In this manner, holes are supplied to the first phosphorescent layer 43 and the second phosphorescent layer 42 via the hole transport layer 41, and electrons are supplied to these emitting layers via the intermediate layer 5. Further, holes are supplied to the fluorescent layer 61 via the intermediate layer 5, and electrons are supplied to this emitting layer via the electron transport layer 62. As a result, the holes and the electrons are recombined in each of these light-emitting layers, resulting in excitons being formed by the energy that has been released by the recombination. The excitons then return to the ground state, releasing (emitting) energy in the form of light such as fluorescent light or phosphorescent light.

The first phosphorescent layer 43, the second phosphorescent layer 42 and the fluorescent layer 61 emit respective lights in the manner described above. Compared to light-emitting devices having a single emitting layer, the light-emitting device 1 that is configured as described above achieves improved luminous efficiency and a decrease in drive voltage.

In particular, the intermediate layer 5 provided between the first phosphorescent layer 43 and the fluorescent layer 61 reliably suppresses or prevents the leakage of energy from the first phosphorescent layer 43 to the fluorescent layer 61. Thus, the light-emitting device 1 achieves excellent luminous efficiency.

For example, the light-emitting device 1 can be configured to emit white light by configuring the light-emitting layers 42, 43 and 61 so as to emit red, green and blue lights, respectively.

The substrate 2 supports the anode 3. Since the light-emitting device 1 in this embodiment is a bottom emission type which emits light through the substrate 2 side, the substrate 2 and the anode 3 are substantially transparent (colorless transparent, colored transparent, or semitransparent).

Exemplary materials of the substrate 2 include resin materials such as polyethylene terephthalate, polyethylene naphthalate, polypropylene, cycloolefin polymer, polyamide, polyethersulfone, polymethyl methacrylate, polycarbonate and polyarylate, and glass materials such as quartz glass and soda glass. These materials may be used singly, or two or more may be used in combination.

The average thickness of the substrate 2 is not particularly limited, but is preferably not less than 0.1 mm and not more than 30 mm, and more preferably not less than 0.1 mm and not more than 10 mm.

In the case where the light-emitting device 1 is a top emission type which emits light through the side opposite to the substrate 2, the substrate 2 may be a transparent substrate or a nontransparent substrate.

Exemplary nontransparent substrates include substrates composed of ceramic materials such as alumina, metal substrates such as stainless steel substrates that have been coated with an oxide layer (an insulating layer), and resin substrates made of resin materials.

The light-emitting device 1 is formed on the substrate 2 described above. Hereinbelow, elements constituting the light-emitting device 1 will be sequentially described.

Anode 3

The anode 3 injects holes into the first emitting section 4 described later. The anode 3 is preferably made of a material having a high work function and excellent conductive properties.

Examples of the materials for the anode 3 include oxides such as ITO (indium tin oxide), IZO (indium zinc oxide), $In_2O_3$, $SnO_2$, Sb-containing $SnO_2$ and Al-containing ZnO, and metals such as Au, Pt, Ag, Cu and alloys containing these metals. These materials may be used singly, or two or more may be used in combination.

The average thickness of the anode 3 is not particularly limited, but is preferably not less than 10 nm and not more than 200 nm, and more preferably not less than 50 nm and not more than 150 nm.

First Emitting Section

As described hereinabove, the first emitting section 4 includes the hole transport layer 41, the second phosphorescent layer 42, and the first phosphorescent layer 43.

In the first emitting section 4, holes and electrons are supplied (injected) from the hole transport layer 41 side and the intermediate layer 5 side, respectively, to the second phosphorescent layer 42 and the first phosphorescent layer 43. The holes and the electrons are recombined within the second phosphorescent layer 42 and the first phosphorescent layer 43, resulting in excitons being formed by the energy that has been released by the recombination. The excitons then return to the ground state, releasing energy in the form of phosphorescent light. In this manner, the second phosphorescent layer 42 and the first phosphorescent layer 43 each emit phosphorescent light.

The layers constituting the first emitting section 4 will be sequentially described below.

Hole Transport Layer

The hole transport layer 41 has a function of transporting holes that have been injected from the anode 3, into the second phosphorescent layer 42.

Exemplary materials for the hole transport layer 41 include various p-type high molecular materials and various p-type low molecular materials, which may be used singly or in combination with one another. Specific examples include tetraarylbenzidine derivatives such as N,N'-di(1-naphthyl)-N,N'-diphenyl-1,1'-diphenyl-4,4'-diamine (NPD) and N,N'-diphenyl-N,N'-bis(3-methylphenyl)-1,1'-diphenyl-4,4'-diamine (TPD); triphenylamine compounds such as 4,4',4''-tris(N-carbazolyl)-triphenylamine (TCTA) and 4,4',4''-tris(N-phenyl-N-m-tolylamino)triphenylamine (m-MTDATA); tetraaryldiaminofluorene compounds; and derivatives of these compounds. These materials may be used singly, or two or more may be used in combination.

Of the materials mentioned above, a triphenylamine compound or a derivative thereof is a more preferred hole transport material. The use of such a material results in a hole transport layer 41 which permits efficient injection of holes from the anode as well as efficient transport of the holes to the second phosphorescent layer 42.

The average thickness of the hole transport layer 41 is not particularly limited, but is preferably not less than 10 nm and not more than 150 nm, and more preferably not less than 10 nm and not more than 100 nm.

Second Phosphorescent Layer

The second phosphorescent layer 42 is composed of a phosphorescent material.

When electrons and holes are supplied (injected) from the cathode 7 side and the anode 3 side, respectively, into the phosphorescent material, the holes and the electrons are recombined within the material, resulting in excitons being formed by the energy that has been released by the recombination. The excitons in the triplet excited state return to the ground state whereby the triplet energy is emitted as phosphorescent light.

The phosphorescent materials are not particularly limited and may be selected appropriately in accordance with the color of light to be emitted by the second phosphorescent layer 42. A single, or two or more phosphorescent materials may be used.

Exemplary red phosphorescent materials include complexes of metals such as iridium, ruthenium, platinum, osmium, rhenium and palladium, and these metal complexes in which at least one ligand has a phenylpyridine skeleton, a bipyridyl skeleton or a porphyrin skeleton. Specific examples include tris(1-phenylisoquinoline) iridium ($Ir(piq)_3$), bis[2-(2'-benzo[4,5-α]thienyl)pyridinato-N,$C^{3'}$]iridium (acetylacetonate) ($btp_2Ir(acac)$) represented by Formula (1) below, 2,3,7,8,12,13,17,18-octaethyl-12H,23H-porphyrin-platinum bis[2-(2'-benzo[4,5-α]thienyl)pyridinato-N,$C^{3'}$]iridium, and bis(2-phenylpyridine) iridium (acetylacetonate).

(1)

Exemplary blue phosphorescent materials include complexes of metals such as iridium, ruthenium, platinum, osmium, rhenium and palladium. Specific examples include bis[4,6-difluorophenyl pyridinato-N,$C^{2'}$]-picolinato-iridium, tris[2-(2,4-difluorophenyl)pyridinato-N,$C^{21}$]iridium, bis[2-(3,5-trifluoromethyl)pyridinato-N,$C^{2'}$]-picolinato-iridium, and bis(4,6-difluorophenyl pyridinato-N,$C^{2'}$) iridium (acetylacetonate).

Exemplary green phosphorescent materials include complexes of metals such as iridium, ruthenium, platinum, osmium, rhenium and palladium. In particular, these metal complexes in which at least one ligand has a phenylpyridine skeleton, a bipyridyl skeleton or a porphyrin skeleton are more preferable. Specific examples include fac-tris(2-phenylpyridine) iridium ($Ir(ppy)_3$) represented by Formula (2) below, bis(2-phenylpyridinato-N,$C^{2'}$) iridium (acetylacetonate), and fac-tris[5-fluoro-2-(5-trifluoromethyl-2-pyridine) phenyl-C,N]iridium.

Ir(ppy)3     (2)

Alternatively, the second phosphorescent layer 42 may be composed of a host material which contains the aforementioned phosphorescent material as a guest material. For example, such a second phosphorescent layer 42 may be formed by doping a host material with a guest material, i.e., the phosphorescent material, as a dopant.

The host material functions as a site where holes and electrons are recombined to form excitons, and transfers the energy of the excitons to the phosphorescent material (Forster transfer or Dexter transfer), thereby exciting the phosphorescent material.

Examples of the host materials include carbazole derivatives such as 3-phenyl-4-(1'-naphthyl)-5-phenylcarbazole and 4,4'-N,N'-dicarbazole biphenyl (CBP) represented by Formula (3) below, phenanthroline derivatives, triazole derivatives, quinolinolate metal complexes such as tris(8-quinolinolato)aluminum (Alq) and bis-(2-methyl-8-quinolinolato)-4-(phenylphenolato)aluminum, carbazolyl group-containing compounds such as N-dicarbazolyl-3,5-benzene, poly(9-vinylcarbazole), 4,4',4"-tris(9-carbazolyl)triphenylamine and 4,4'-bis(9-carbazolyl)-2,2'-dimethylbiphenyl, and 2,9-dimethyl-4,7-diphenyl-1,10-phenanthroline (BCP). These materials may be used singly, or two or more may be used in combination.

CBP     (3)

When the phosphorescent material (the guest material) and the host material are used, the content (dosage) of the phosphorescent material in the second phosphorescent layer 42 is preferably 0.1 to 30 wt %, and more preferably 0.5 to 20 wt %. This content of the phosphorescent material ensures that the luminous efficiency is optimized.

The average thickness of the second phosphorescent layer 42 is preferably not less than 30 nm and not more than 100 nm, more preferably not less than 30 nm and not more than 70 nm, and still more preferably not less than 30 nm and not more than 50 nm. The second phosphorescent layer 42 having this average thickness is not excessively thick, and thus prevents an increase in the initial drive voltage of the light-emitting device 1. That is, the above average thickness enables lowering of the drive voltage of the light-emitting device 1.

First Phosphorescent Layer

The first phosphorescent layer (the phosphorescent emitting layer) 43 is composed of a phosphorescent material.

In this embodiment, the first phosphorescent layer 43 is in contact with the second phosphorescent layer 42. This configuration facilitates an arrangement of both the first phosphorescent layer 43 and the second phosphorescent layer 42 within the hole-electron recombination region in the first emitting section 4. As a result, it becomes easy for both the first phosphorescent layer 43 and the second phosphorescent layer 42 to emit light.

The phosphorescent materials are not particularly limited, and those materials mentioned for the second phosphorescent layer 42 may be used. The phosphorescent material used in the first phosphorescent layer 43 may be the same or different from the phosphorescent material in the second phosphorescent layer 42. The color emitted by the first phosphorescent layer 43 may be the same or different from the color emitted by the second phosphorescent layer 42.

Alternatively, the first phosphorescent layer 43 may be composed of a host material which contains the phosphorescent material as a guest material.

When the phosphorescent material (the guest material) and the host material are used, the content (dosage) of the phosphorescent material in the first phosphorescent layer 43 is preferably 0.1 to 30 wt %, and more preferably 0.5 to 20 wt %. This content of the phosphorescent material ensures that the luminous efficiency is optimized.

The peak wavelength of the light emitted by the first phosphorescent layer 43 is preferably shorter than the peak wavelength of the light emitted by the second phosphorescent layer 42. According to this configuration, the first phosphorescent layer 43 and the second phosphorescent layer 42 can emit respective lights in a well balanced manner.

The average thickness of the first phosphorescent layer 43 is not particularly limited, but is preferably not less than 5 nm and not more than 50 nm, more preferably not less than 5 nm and not more than 40 nm, and still more preferably not less than 5 nm and not more than 30 nm. The first phosphorescent layer 43 having this average thickness suppresses an increase in the drive voltage of the light-emitting device 1 and can emit light efficiently. In particular, in the case where the second phosphorescent layer 42 and the first phosphorescent layer 43 are stacked one on top of the other as in this embodiment, configuring the first phosphorescent layer 43 so as to have a relatively small thickness facilitates the arrangement of both the second phosphorescent layer 42 and the first phosphorescent layer 43 within the hole-electron recombination region in the first emitting section 4. Further, such a configuration permits these layers to emit light in a well balanced manner.

In this embodiment, the first emitting section 4 is described as having two emitting layers (namely, the second phosphorescent layer 42 and the first phosphorescent layer 43). However, the first emitting section 4 may contain a single emitting layer. That is, one of the second phosphorescent layer 42 and the first phosphorescent layer 43 in the first emitting section 4 may be omitted. In another embodiment, the first emitting section 4 may contain three or more emitting layers. That is, the first emitting section 4 may have another one or more emitting layers in addition to the second phosphorescent layer 42 and the first phosphorescent layer 43. In the case where the first emitting section 4 has a plurality of phosphorescent layers, the plurality of phosphorescent layers may emit lights of the same or different colors. Further, when the first emitting section 4 has a plurality of phosphorescent layers, an intermediate layer may be provided between the phosphorescent layers.

Intermediate Layer

The intermediate layer 5 has a function of mediating the passage of carriers (holes and electrons) between the first emitting section 4 and the second emitting section 6, and to suppress or prevent the leakage of triplet energy from the first phosphorescent layer 43 to the fluorescent layer 61.

The intermediate layer 5 having such functions is a multilayer structure in which an electron transport layer 51 located on the anode 3 side and a hole transport layer 52 located on the cathode 7 side are stacked in contact with each other.

Hereinbelow, the layers constituting the intermediate layer 5 will be sequentially described.

Electron Transport Layer

The electron transport layer 51 is provided between the aforementioned first phosphorescent layer 43 and the hole transport layer 52 and has a function of transporting electrons from the hole transport layer 52 side to the first phosphorescent layer 43 side.

Exemplary materials (electron transport materials) for constituting the electron transport layer 51 include quinoline derivatives such as organometallic complexes having a 8-quinolinol or 8-quinolinol derivative ligand such as tris(8-quinolinolato)aluminum ($Alq_3$), phenanthroline derivatives such as 2,9-dimethyl-4,7-diphenyl-1,10-phenanthroline (BCP), oxadiazole derivatives, perylene derivatives, pyridine derivatives, pyrimidine derivatives, quinoxaline derivatives, diphenylquinone derivatives and nitro-substituted fluorene derivatives. These materials may be used singly, or two or more may be used in combination.

The average thickness of the electron transport layer 51 is not particularly limited, but is preferably not less than 2 nm and not more than 10 nm, and more preferably not less than 3 nm and not more than 7 nm. If the average thickness of the electron transport layer 51 is smaller than the lower limit, the electron transport layer 51 may have a low efficiency in transporting the electrons injected from the hole transport layer 52 side toward the first phosphorescent layer 43 side, depending on the kind of electron transport material forming the electron transport layer 51. If the average thickness is in excess of the upper limit, a decreased efficiency may be caused when holes are injected from the first phosphorescent layer 43 into the hole transport layer 52 through the electron transport layer 51 utilizing the tunnel effect.

Hole Transport Layer

The hole transport layer 52 is provided between the aforementioned fluorescent layer 61 and the electron transport layer 51 and has a function of transporting holes from the electron transport layer 51 side to the fluorescent layer 61 side.

Exemplary materials for the hole transport layer 52 include various p-type high-molecular-weight materials and various p-type low-molecular-weight materials, which may be used singly or in combination with one another. Specific examples include tetraarylbenzidine derivatives such as N,N'-di(1-naphthyl)-N,N'-diphenyl-1,1'-diphenyl-4,4'-diamine (NPD) and N,N'-diphenyl-N,N'-bis(3-methylphenyl)-1,1'-diphenyl-4,4'-diamine (TPD); triphenylamine compounds such as 4,4', 4"-tris(N-carbazolyl)-triphenylamine (TCTA) and 4,4',4"-tris(N-phenyl-N-m-tolylamino)triphenylamine (m-MTDATA); tetraaryldiaminofluorene compounds; and derivatives (amine compounds) of these compounds. These materials may be used singly, or two or more may be used in combination.

Of the materials mentioned above, a triphenylamine compound or a derivative thereof is a more preferred hole transport material. The use of such a material results in a hole transport layer 52 which can efficiently transport holes from the electron transport layer 51 side toward the fluorescent layer 61 side.

The average thickness of the hole transport layer 52 is not particularly limited, but is preferably not less than 2 nm and not more than 10 nm, and more preferably not less than 3 nm and not more than 7 nm. If the average thickness of the hole transport layer 52 is smaller than the lower limit, the hole transport layer 52 may have a low efficiency in transporting the holes injected from the electron transport layer 51 side toward the fluorescent layer 61 side, depending on the kind of hole transport material forming the hole transport layer 52. If the average thickness is in excess of the upper limit, a decreased efficiency may be caused when electrons are injected from the fluorescent layer 61 into the electron transport layer 51 through the hole transport layer 52 utilizing the tunnel effect.

As mentioned above, the intermediate layer 5 in the invention has the hole transport layer 52 and the electron transport layer 51 in contact with each other, and the electron transport layer 51 is located on the anode 3 side and the hole transport layer 52 on the cathode 7 side.

Studies conducted by the inventor of this invention have found that the aforementioned problems in the art can be solved in accordance with the above configuration of the intermediate layer 5 located between the first phosphorescent layer (the phosphorescent emitting layer) 43 and the fluorescent layer 61. That is, it has been found that the above configuration of the intermediate layer 5 reliably suppresses or prevents an increase in the drive voltage of the light-emitting device 1 and ensures that the triplet energy of the first phosphorescent layer 43 is suppressed from being transferred toward the fluorescent layer 61 side and thereby both the first phosphorescent layer 43 and the fluorescent layer 61 can emit light with good efficiency.

In particular, according to the invention, the electron transport layer 51 is located on the anode 3 side and the hole transport layer 52 on the cathode 7 side. With this arrangement, the electron transport layer 51 and the hole transport layer 52 produce the tunnel effect so that the carriers (electrons and holes) can be smoothly transported through the intermediate layer 5 while the intermediate layer 5 reliably suppresses the transfer of the triplet energy of the first phosphorescent layer 43 toward the fluorescent layer 61.

In this embodiment, the first phosphorescent layer 43 and the second phosphorescent layer 42 are located between the anode 3 and the intermediate layer 5, and the fluorescent layer 61 is located between the cathode 7 and the intermediate layer 5. That is, the first phosphorescent layer 43 and the second phosphorescent layer 42 are located on the anode 3 side, and the fluorescent layer 61 is located on the cathode 7 side, with the intermediate layer 5 therebetween.

In order to collect efficiently the light emitted from each of the light-emitting layers, it is necessary to adjust the light path length. That is, the efficiency in collecting the light can be improved by locating a layer emitting a shorter wavelength light on the cathode side and a layer emitting a longer wavelength light on the anode side. Of luminous materials emitting short wavelength (in particular, blue) light, materials that emit fluorescent light generally surpass phosphorescent materials in terms of luminous color, luminous efficiency and life. Thus, the above relation of the positions of the fluorescent layer 61, the first phosphorescent layer 43 and the second phosphorescent layer 42 ensures that each of the light-emitting layers emits light more reliably and the emitted lights can be collected with improved efficiency.

Further, it is preferable that one of the triplet energy of the hole transport layer 52 and the triplet energy of the electron transport layer 51 be larger than the triplet energy of the first phosphorescent layer 43. It is more preferable that both triplet energies be larger than the triplet energy of the first phosphorescent layer 43. This configuration can reliably suppress or prevent the triplet energy of the first phosphorescent layer 43 from being transferred toward the fluorescent layer 61 side and being consequently deactivated without contributing to light emission. Thus, the light-emitting device 1 achieves particularly excellent luminous efficiency.

The average thickness of the intermediate layer 5, namely, the total average thickness of the electron transport layer 51 and the hole transport layer 52 is preferably not more than 15 nm, and is more preferably not less than 5 nm and not more than 12 nm. This average thickness ensures that an increase in the drive voltage of the light-emitting device 1 is prevented more reliably while the intermediate layer 5 fully displays its functions.

Second Emitting Section

As described hereinabove, the second emitting section 6 includes the fluorescent layer 61 and the electron transport layer 62.

In the second emitting section 6, holes and electrons are supplied (injected) from the intermediate layer 5 side and the cathode 7 side, respectively, into the fluorescent layer 61. The holes and the electrons are recombined within the fluorescent layer 61, resulting in excitons being formed by the energy that has been released by the recombination. The excitons then return to the ground state, releasing energy in the form of fluorescent light. In this manner, the fluorescent layer 61 emits fluorescent light.

The layers constituting the second emitting section 6 will be sequentially described below.

Fluorescent Layer

The fluorescent layer 61 is composed of a fluorescent material.

When electrons and holes are supplied (injected) from the cathode 7 side and the anode 3 side, respectively, into the fluorescent material, the holes and the electrons are recombined within the material, resulting in excitons being formed by the energy that has been released by the recombination. The excitons in the singlet excited state return to the ground state whereby the singlet energy is emitted as fluorescent light.

The fluorescent materials are not particularly limited and may be selected appropriately in accordance with the color of light to be emitted by the fluorescent layer 61. A single, or two or more fluorescent materials may be used.

Exemplary red fluorescent materials include perylene derivatives such as tetraaryldiindenoperylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl) ethenyl)-4H-pyran-4-ylidene) propanedinitrile (DCJTB) and 4-dicyanomethylene-2-methyl-6-(p-dimethylaminostyryl)-4H-pyran (DCM).

Exemplary blue fluorescent materials include distyryldiamine derivatives, distyryl derivatives, fluoranthene derivatives, pyrene derivatives, perylene, perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-ortho-co-(2-methoxy-5-{2-ethoxyhexyloxy}phenylene-1,4-diyl)], poly[(9,9-dioctylfluorene-2,7-diyl)-co-(ethynylbenzene)] and BD102 (product name, manufactured by Idemitsu Kosan Co., Ltd.).

Exemplary green fluorescent materials include coumarin derivatives, quinacridone derivatives, 9,10-bis[(9-ethyl-3-carbazol)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-[{2-ethylhexyloxy}benzene)] and poly[(9,9-dioctyl-2,7-divinylenefluorenylene-ortho-co-(2-methoxy-5-(2-ethoxy] hexyloxy)-1,4-phenylene)].

Exemplary yellow fluorescent materials include compounds which have a naphthacene skeleton and in which the naphthacene has been substituted with an arbitrary number (preferably 2 to 6) of aryl groups (preferably phenyl groups) at arbitrary positions with specific examples including rubrene materials, and monoindenoperylene derivatives.

Alternatively, the fluorescent layer 61 may be composed of a host material which contains the aforementioned fluorescent material as a guest material, similarly to the phosphorescent materials (layers). For example, such a fluorescent layer 61 may be formed by doping a host material with a guest material, i.e., the fluorescent material, as a dopant.

The host material functions as a site where holes and electrons are recombined to form excitons, and transfers the energy of the excitons to the fluorescent material (Forster transfer or Dexter transfer), thereby exciting the fluorescent material.

Examples of the host materials include rubrene, rubrene derivatives, distyrylarylene derivatives, naphthacene materials such as bis p-biphenylnaphthacene, anthracene materials, perylene derivatives such as bis-ortho-biphenylylperylene, pyrene derivatives such as tetraphenylpyrene, distyrylbenzene derivatives, stilbene derivatives, distyrylamine derivatives, quinolinolate metal complexes such as bis(2-methyl-8-quinolinolato) (p-phenylphenolato)aluminum (BAlq) and tris (8-quinolinolato)aluminum complex ($Alq_3$), triarylamine derivatives such as triphenylamine tetramers, arylamine derivatives, oxadiazole derivatives, silole derivatives, carbazole derivatives, oligothiophene derivatives, benzopyran derivatives, triazole derivatives, benzoxazole derivatives, benzothiazole derivatives, quinoline derivatives, coronene derivatives, amine compounds, 4,4'-bis(2,2'-diphenylvinyl) biphenyl (DPVBi) and IDE120 (product name, manufactured by Idemitsu Kosan Co., Ltd.). These materials may be used singly, or two or more may be used in combination. When the fluorescent material is blue or green, IDE120 (manufactured by Idemitsu Kosan Co., Ltd.), anthracene materials and dianthracene materials are preferred. When the fluorescent material is red, rubrene, rubrene derivatives, naphthacene materials and perylene derivatives are preferable.

When the fluorescent material (the guest material) and the host material are used, the content (dosage) of the fluorescent material in the fluorescent layer 61 is preferably 0.1 to 30 wt %, and more preferably 0.5 to 20 wt %. This content of the fluorescent material ensures that the luminous efficiency is optimized.

The peak wavelength of the light emitted by the fluorescent layer 61 is preferably shorter than the peak wavelength of the light emitted by the first phosphorescent layer 43 and that of the light emitted by the second phosphorescent layer 42. In other words, it is preferable that the peak wavelength of the light emitted by the first phosphorescent layer 43 and that of the light emitted by the second phosphorescent layer 42 be longer than the peak wavelength of the light emitted by the fluorescent layer 61. According to this configuration, the fluorescent layer 61, the first phosphorescent layer 43 and the second phosphorescent layer 42 can emit respective lights in a well balanced manner.

In detail, the peak wavelength of the light emitted by the fluorescent layer 61 is preferably not more than 500 nm, more preferably not less than 400 nm and not more than 490 nm, and still more preferably not less than 430 nm and not more than 480 nm. In other words, the light emitted by the fluorescent layer 61 is preferably blue light.

As already described, it is preferable that the peak wavelength of the light emitted by the second phosphorescent layer 42 be longer than the peak wavelength of the light emitted by the first phosphorescent layer 43, whereby the second phosphorescent layer 42, the first phosphorescent layer 43 and the fluorescent layer 61 can emit respective lights in a well balanced manner. Accordingly, when the color of the light emitted by the fluorescent layer 61 is blue, the colors of the lights emitted by the second phosphorescent layer 42 and the first phosphorescent layer 43 are preferably red and green, respectively.

It is more difficult for a fluorescent material emitting light of a shorter peak wavelength to become luminous than a fluorescent material emitting light of a longer peak wavelength. However, because the fluorescent layer 61 is not adjacent to any emitting layers, even a fluorescent material emitting short peak wavelength light can be luminous efficiently because the energy is unlikely to escape to other emitting layers.

The average thickness of the fluorescent layer 61 is preferably not less than 30 nm and not more than 100 nm, more preferably not less than 30 nm and not more than 70 nm, and still more preferably not less than 30 nm and not more than 50 nm. The fluorescent layer 61 having this average thickness is not excessively thick, and thus prevents an increase in the initial drive voltage of the light-emitting device 1. That is, this configuration allows for the reduction in drive voltage of the light-emitting device 1.

Figure 6:
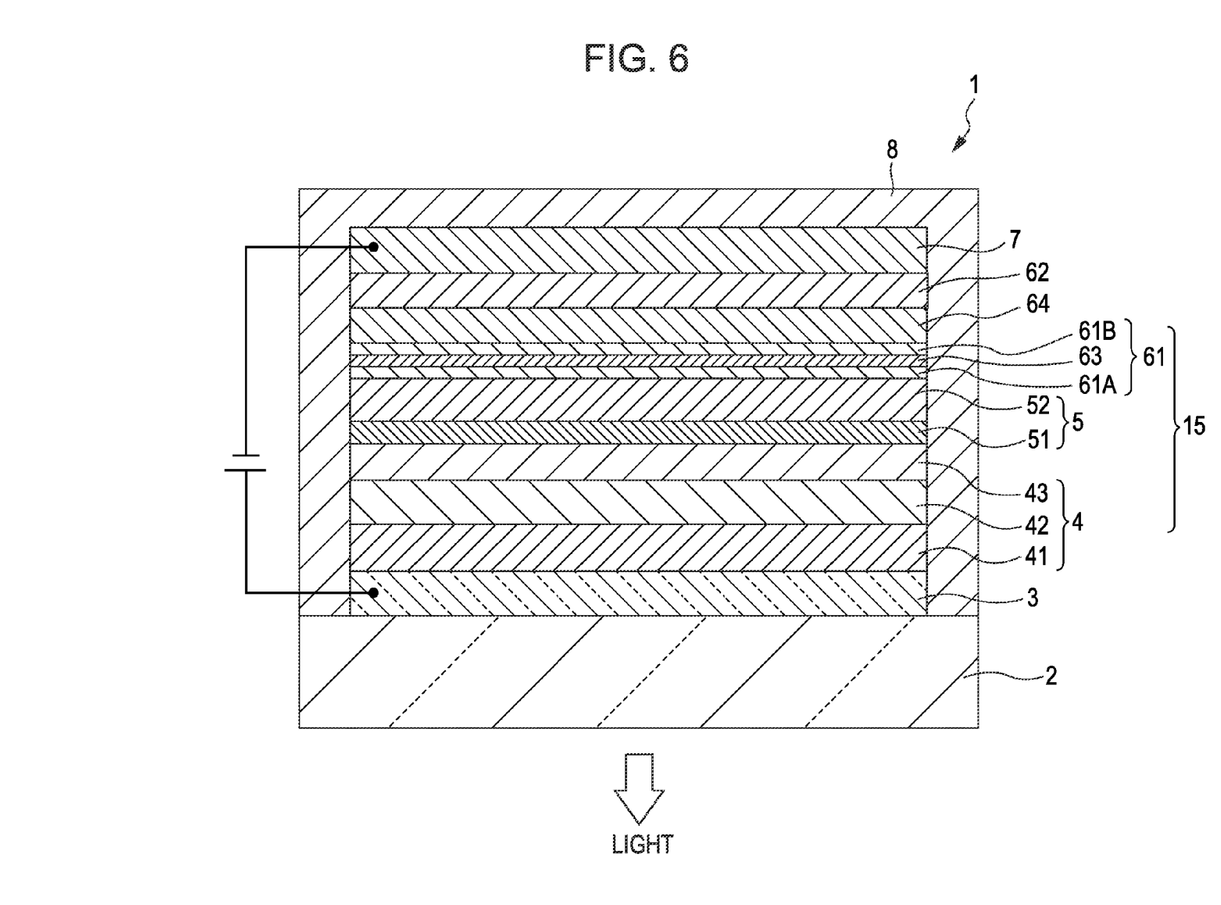
FIG. 6 is a view that schematically illustrates a vertical cross section of a light-emitting device according to another embodiment of the invention.

Although the fluorescent layer 61 in this embodiment is described as being a single emitting layer, as shown in FIG. 6, the fluorescent layer 61 may be a multilayer structure in which a plurality of emitting layers 61A and 61B are stacked on top of one another. In such a case, the plurality of emitting layers may emit lights of the same or different colors. Further, in the case where the fluorescent layer 61 has a plurality of emitting layers 61A and 61B, an intermediate layer 63 may be provided between the emitting layers.

Electron Transport Layer

The electron transport layer 62 has a function of transporting the electrons injected from the cathode 7 into the fluorescent layer 61.

Exemplary materials (electron transport materials) for the electron transport layer 62 include quinoline derivatives such as organometallic complexes having a 8-quinolinol or 8-quinolinol derivative ligand such as tris(8-quinolinolato) aluminum ($Alq_3$), phenanthroline derivatives such as 2,9-dimethyl-4,7-diphenyl-1,10-phenanthroline (BCP), oxadiazole derivatives, perylene derivatives, pyridine derivatives, pyrimidine derivatives, quinoxaline derivatives, diphenylquinone derivatives and nitro-substituted fluorene derivatives. These materials may be used singly, or two or more may be used in combination.

The average thickness of the electron transport layer 62 is not particularly limited, but is preferably not less than 10 nm and not more than 100 nm, and more preferably not less than 10 nm and not more than 50 nm.

As shown in FIG. 6, the second emitting section 6 may have another layer in addition to the fluorescent layer 61 and the electron transport layer 62. For example, it may have a hole blocking layer 64 between the fluorescent layer 61 and the electron transport layer 62, or an electron injection layer between the electron transport layer 62 and the cathode 7.

Hole Blocking Layer

The hole blocking layer has a function of blocking the holes. Incorporating the hole blocking layer thus prevents the holes from being transported from the fluorescent layer 61 to the electron transport layer 62, thereby preventing a degradation of the electron transport layer 62 by the holes. Further, the hole blocking layer has another function of transporting the electrons. Thus, the electrons coming from the electron transport layer 62 can be transported to the fluorescent layer 61.

Exemplary materials for the hole blocking layer include carbazole derivatives such as 3-phenyl-4-(1'-naphthyl)-5-phenylcarbazole and 4,4'-N,N'-dicarbazole biphenyl (CBP), phenanthroline derivatives, triazole derivatives, quinolinolate metal complexes such as tris(8-quinolinolato)aluminum (Alq) and bis-(2-methyl-8-quinolinolato)-4-(phenylphenolato)aluminum, carbazolyl group-containing compounds such as N-dicarbazolyl-3,5-benzene, poly(9-vinylcarbazole), 4,4',4''-tris(9-carbazolyl)triphenylamine and 4,4'-bis(9-carbazolyl)-2,2'-dimethylbiphenyl, and 2,9-dimethyl-4,7-diphenyl-1,10-phenanthroline (BCP). These materials may be used singly, or two or more may be used in combination.

The average thickness of the hole blocking layer is not particularly limited, but is preferably not less than 1 nm and not more than 50 nm, more preferably not less than 3 nm and not more than 30 nm, and still more preferably not less than 5 nm and not more than 20 nm.

Electron Injection Layer

The electron injection layer may be provided in order to improve the efficiency in injecting the electrons from the cathode 7 to the electron transport layer 62.

Examples of the materials (electron injection materials) for the electron injection layer include various inorganic insulating materials and inorganic semiconductor materials.

Examples of the inorganic insulating materials include alkali metal chalcogenides (oxides, sulfides, selenides, tellurides), alkaline earth metal chalcogenides, alkali metal halides and alkaline earth metal halides. These materials may be used singly, or two or more may be used in combination. An electron injection layer based on any of these materials allows for higher electron injection properties. In particular, alkali metal compounds (for example, alkali metal chalcogenides and alkali metal halides) have a very low work function, and therefore electron injection layers formed using such materials enable the light-emitting devices 1 to show higher luminance.

Examples of the alkali metal chalcogenides include $Li_2O$, LiO, $Na_2S$, $Na_2Se$ and NaO.

Examples of the alkaline earth metal chalcogenides include CaO, BaO, SrO, BeO, BaS, MgO and CaSe.

Examples of the alkali metal halides include CsF, LiF, NaF, KF, LiCl, KCl and NaCl.

Examples of the alkaline earth metal halides include $CaF_2$, $BaF_2$, $SrF_2$, $MgF_2$ and $BeF_2$.

Examples of the inorganic semiconductor materials include oxides, nitrides and oxynitrides containing at least one element of Li, Na, Ba, Ca, Sr, Yb, Al, Ga, In, Cd, Mg, Si, Ta, Sb and Zn. These materials may be used singly, or two or more may be used in combination.

The average thickness of the electron injection layer is not particularly limited, but is preferably not less than 0.1 nm and not more than 1000 nm, more preferably not less than 0.2 nm and not more than 100 nm, and still more preferably not less than 0.2 nm and not more than 50 nm.

Cathode

The cathode 7 is an electrode that injects electrons into the aforementioned second emitting section 6. The cathode 7 is preferably composed of a material having a low work function.

Examples of the materials for forming the cathode 7 include Li, Mg, Ca, Sr, La, Ce, Er, Eu, Sc, Y, Yb, Ag, Cu, Al, Cs, Rb and alloys containing these metals. These materials may be used singly, or two or more may be used in combination (for example a multilayer structure having a plurality of layers of these metals).

In particular, when the cathode 7 is formed of an alloy, the alloy preferably includes a stable metal such as Ag, Al or Cu. Specific examples of such alloys include MgAg, AlLi and CuLi. When the cathode 7 is formed of such an alloy, the cathode 7 achieves improved electron injection efficiency as well as higher stability.

The average thickness of the cathode 7 is not particularly limited, but is preferably not less than 100 nm and not more than 400 nm, and more preferably not less than 100 nm and not more than 200 nm.

Because the light-emitting device 1 in this embodiment is a bottom emission type, the cathode 7 does not particularly need optical transparency.

Sealing Member

The sealing member 8 is formed so as to cover the anode 3, the multilayer structure 15 and the cathode 7, and provides an airtight seal to block oxygen or water. The sealing member 8 provides advantages such as improved reliability of the light-emitting device 1 and prevention of degradation or changes in quality (improved durability).

Exemplary materials for forming the sealing member 8 include Al, Au, Cr, Nb, Ta, Ti, alloys containing these metals, silicon oxides and various resin materials. In the case where the sealing member 8 is formed of a conductive material, it is preferable that an insulating layer be provided as required between the sealing member 8 and each of the anode 3, the multilayer structure 15 and the cathode 7 in order to prevent short circuits.

In another embodiment, the sealing member 8 may be a flat plate that is provided so as to oppose the substrate 2, and a sealant such as a thermosetting resin may be applied to seal between the plate and the substrate.

According to the light-emitting device 1 described above, the intermediate layer 5 has the hole transport layer 52 and the electron transport layer 51 that are in contact with each other, and the electron transport layer 51 is located on the anode 3 side and the hole transport layer 52 is located on the cathode 7 side. This configuration reliably suppresses or prevents an increase in the drive voltage of the light-emitting device 1, and ensures that the triplet energy of the first phosphorescent layer 43 is suppressed from being transferred toward the fluorescent layer 61 side and thereby both the first phosphorescent layer 43 and the fluorescent layer 61 can emit light with good efficiency.

Although the above embodiment has described that the first phosphorescent layer 43 and the second phosphorescent layer 42 are located between the anode 3 and the intermediate layer 5, and the fluorescent layer 61 is located between the cathode 7 and the intermediate layer 5, the scope of the invention is not limited to such configurations. For example, the first phosphorescent layer 43 and the second phosphorescent layer 42 may be located between the cathode 7 and the intermediate layer 5, and the fluorescent layer 61 may be located between the anode 3 and the intermediate layer 5.

Processes for Producing Light-Emitting Devices

For example, the light-emitting device 1 that is configured as described above may be produced as follows.

1. First, the substrate 2 is provided, and the anode 3 is formed on the substrate 2.

The anode 3 may be produced by any of chemical vapor deposition (CVD) methods such as plasma CVD and thermal CVD, dry plating methods such as vacuum deposition, wet plating methods such as electroplating, thermal spraying methods, sol-gel processes, MOD methods, and bonding of metal foils.

2. Next, the first emitting section 4 is formed on the anode 3.

The first emitting section 4 may be provided by sequentially forming the hole transport layer 41, the second phosphorescent layer 42 and the first phosphorescent layer 43 on the anode 3.

These layers may be each produced by a gas phase process, for example a CVD method or a dry plating method such as vacuum deposition or sputtering.

Alternatively, a liquid material in which the material for forming each layer is dissolved in a solvent or dispersed in a dispersion medium, may be supplied onto the anode 3 (or the layer(s) formed thereon) and thereafter dried (removing the solvent or the dispersion medium), thereby forming the above-described layers.

The liquid materials may be supplied by any of various application methods such as spin coating, roll coating and ink jet printing. These application methods allow for relatively easy formation of the layers constituting the first emitting section 4.

Examples of the solvents or the dispersion media used to prepare the liquid materials include various inorganic solvents, organic solvents, and mixtures containing these solvents.

For example, the layers may be dried by being allowed to stand in an atmospheric pressure or a reduced pressure atmosphere, by heat treatment, or by blowing an inert gas to the layer.

Prior to this step, the upper surface of the anode 3 may be subjected to oxygen plasma treatment. The oxygen plasma treatment gives lipophilicity on the upper surface of the anode 3, removes organic substances attached on the upper surface of the anode 3 (cleanses the upper surface), and controls the work function in the vicinity of the upper surface of the anode 3.

The oxygen plasma treatment is preferably performed at a plasma power of about 100 to 800 W, an oxygen gas flow rate of about 50 to 100 mL/min, a transport speed for the member (anode 3) of about 0.5 to 10 mm/sec, and a temperature of the substrate 2 of about 70 to 90° C.

3. Next, the intermediate layer 5 is formed on the first emitting section 4.

The intermediate layer 5 may be formed by sequentially stacking the electron transport layer 51 and the hole transport layer 52 on the first emitting section 4.

The layers constituting the intermediate layer 5 may be each produced by a gas phase process, for example a CVD method or a dry plating method such as vacuum deposition or sputtering.

Alternatively, a liquid material in which the material for forming each layer of the intermediate layer 5 is dissolved in a solvent or dispersed in a dispersion medium, may be supplied onto the first emitting section 4 and thereafter dried (removing the solvent or the dispersion medium), thereby forming the above-described layers.

4. Next, the second emitting section 6 is formed on the intermediate layer 5.

The second emitting section 6 may be formed in a similar manner to that for forming the first emitting section 4.

5. Next, the cathode 7 is formed on the second emitting section 6.

For example, the cathode 7 may be formed by a vacuum deposition method, a sputtering method, bonding a metal foil, or applying a metal fine particle ink followed by calcination.

The light-emitting device 1 may be manufactured through the steps described above.

Finally, the sealing member 8 is provided and joined to the substrate 2 so as to cover the light-emitting device 1.

The light-emitting device 1 described hereinabove may be used as, for example, a light source. Further, a plurality of the light-emitting devices 1 may be arranged in a matrix pattern so as to constitute a display (an embodiment of the display device according to an aspect of the invention).

The drive system of the display is not particularly limited, and the display may be an active matrix display or a passive matrix display.

Display Device

Next, an embodiment of a display as an example of the inventive display device will be described.

Figure 2:
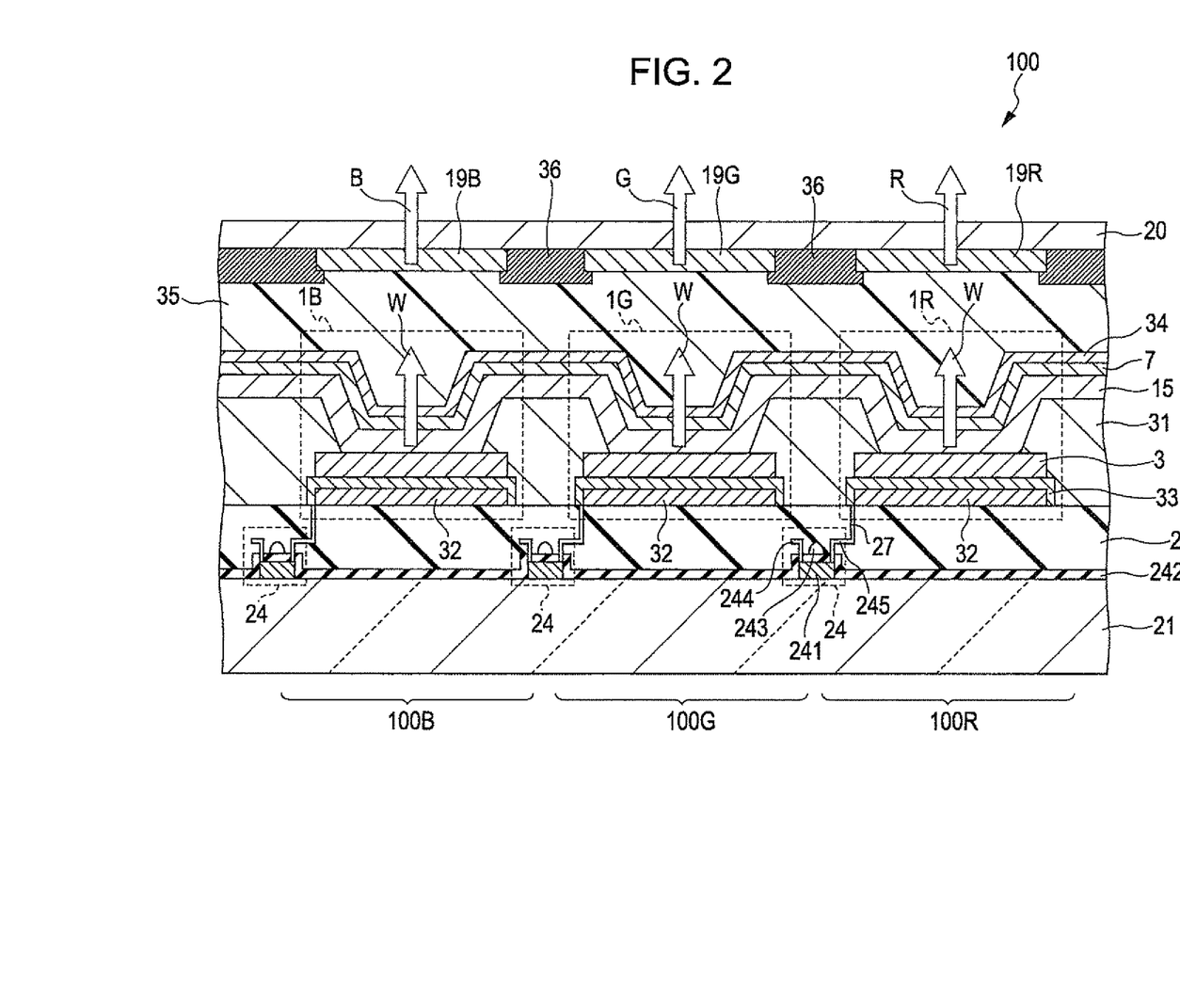
FIG. 2 is a vertical sectional view of an embodiment of a display as an example of a display device according to an aspect of the invention.

FIG. 2 is a vertical sectional view illustrating an embodiment of a display as an example of the inventive display device.

A display 100 illustrated in FIG. 2 has a substrate 21, a plurality of light-emitting devices 1R, 1G and 1B and a plurality of color filters 19R, 19G and 19B that are provided in accordance with sub-pixels 100R, 100G and 100B, and a plurality of driving transistors 24 for driving the respective light-emitting devices 1R, 1G and 1B. In this embodiment, the display 100 is a top emission display panel.

On the substrate 21, a plurality of the driving transistors 24 are provided. A planarization layer 22 made of an insulating material is formed so as to cover the driving transistors 24.

Each driving transistor 24 has a silicon semiconductor layer 241, a gate insulating layer 242 formed on the semiconductor layer 241, a gate electrode 243 formed on the gate insulating layer 242, a source electrode 244, and a drain electrode 245.

On the planarization layer 22, the light-emitting devices 1R, 1G and 1B are provided in accordance with the respective driving transistors 24.

In the light-emitting device 1R, a reflective layer 32, an anticorrosive layer 33, an anode 3, a multilayer structure (an organic EL section) 15, a cathode 7 and a cathode cover 34 are stacked in this order on the planarization layer 22. In this embodiment, the anodes 3 of the light-emitting devices 1R, 1G and 1B constitute pixel electrodes and are electrically connected to the respective drain electrodes 245 of the respective driving transistors 24 via conductive sections (wires) 27. The cathodes 7 of the light-emitting devices 1R, 1G and 1B are a common electrode.

The structure of the light-emitting devices 1G and 1B are the same as that of the light-emitting device 1R. In FIG. 2, elements that are similar to those shown in FIG. 1 are assigned with the identical numbers. The structures (properties) of the reflective layers 32 may vary among the light-emitting devices 1R, 1G and 1B in accordance with the wavelength of the light.

Partition walls 31 are provided between adjacent devices of the light-emitting devices 1R, 1G and 1B. An epoxy layer 35 made of an epoxy resin is formed so as to cover the light-emitting devices 1R, 1G and 1B.

The color filters 19R, 19G and 19B are provided on the epoxy layer 35 in accordance with the light-emitting devices 1R, 1G and 1B.

The color filter 19R converts white light W emitted from the light-emitting device 1R to red light. The color filter 19G converts white light W emitted from the light-emitting device 1G to green light. The color filter 19B converts white light W emitted from the light-emitting device 1B to blue light. Combinations of these color filters 19R, 19G and 19B with the light-emitting devices 1R, 1G and 1B allow for full color images.

Light blocking layers 36 are formed between adjacent color filters of 19R, 19G and 19B, thereby preventing the sub-pixels 100R, 100G and 100B from emitting unintended light.

A sealing substrate 20 is provided so as to cover the color filters 19R, 19G and 19B and the light blocking layers 36.

The display 100 described above can display an image in a single color or in various colors by appropriately selecting the emitting materials used in the light-emitting devices 1R, 1G and 1B.

The display 100 (an embodiment of the inventive display device) may be incorporated into various electronic apparatuses.

Figure 3:
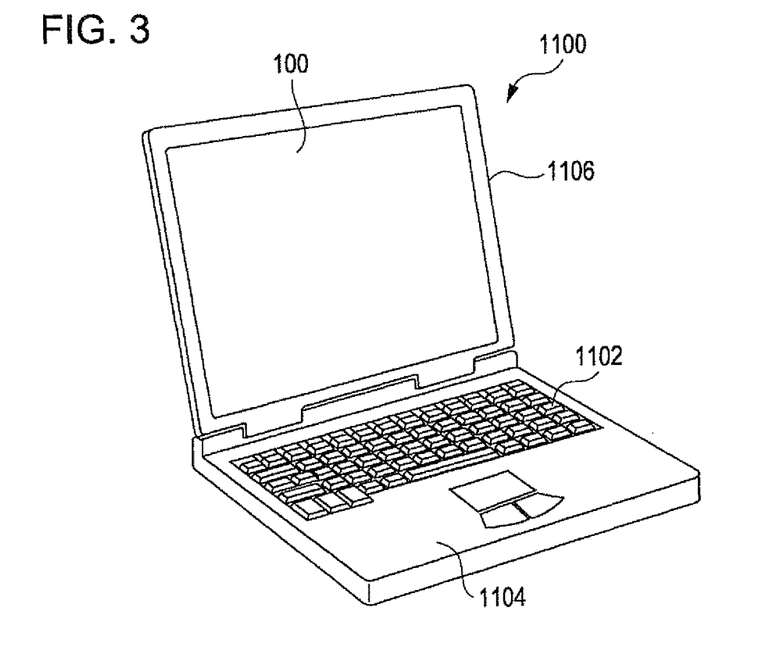
FIG. 3 is a perspective view that illustrates a structure of a mobile (or notebook) personal computer as an embodiment of an electronic apparatus according to an aspect of the invention.

FIG. 3 is a perspective view that illustrates a structure of a mobile (or notebook) personal computer as an embodiment of an electronic apparatus according to an aspect of the invention.

In the figure, a personal computer 1100 includes a body 1104 having a keyboard 1102, and a display unit 1106 having a display section. The display unit 1106 is rotatably supported with respect to the body 1104 via a hinge structure.

In this personal computer 1100, the display section in the display unit 1106 is constituted by the display 100 described above.

Figure 4:
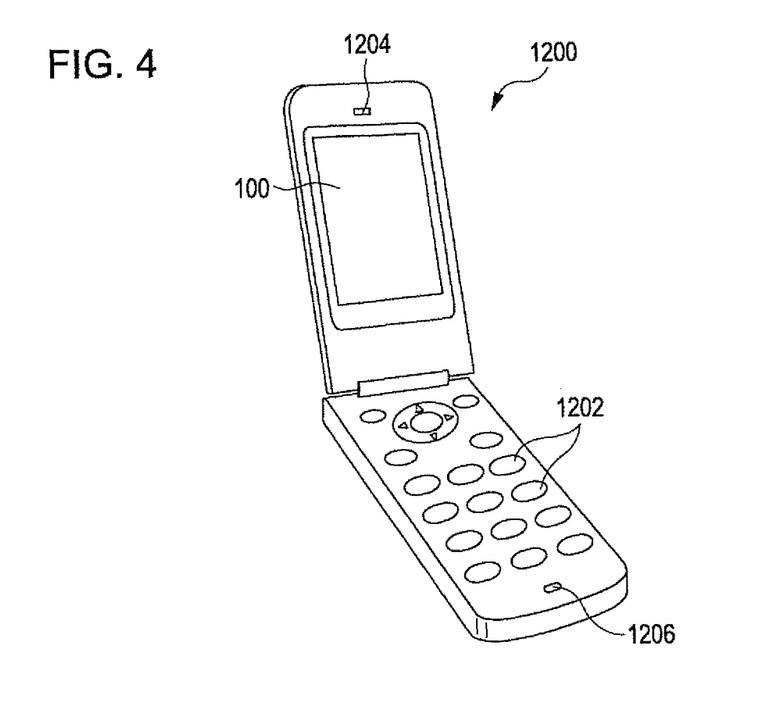
FIG. 4 is a perspective view that illustrates a structure of a cellular phone (or a PHS) as an embodiment of an electronic apparatus according to an aspect of the invention.

FIG. 4 is a perspective view that illustrates a structure of a cellular phone (or a PHS) as an embodiment of an electronic apparatus according to an aspect of the invention.

In the figure, a cellular phone 1200 includes a plurality of operation buttons 1202, an ear piece 1204, a mouthpiece 1206, and a display section.

In this cellular phone 1200, the display section is constituted by the display 100 described above.

Figure 5:
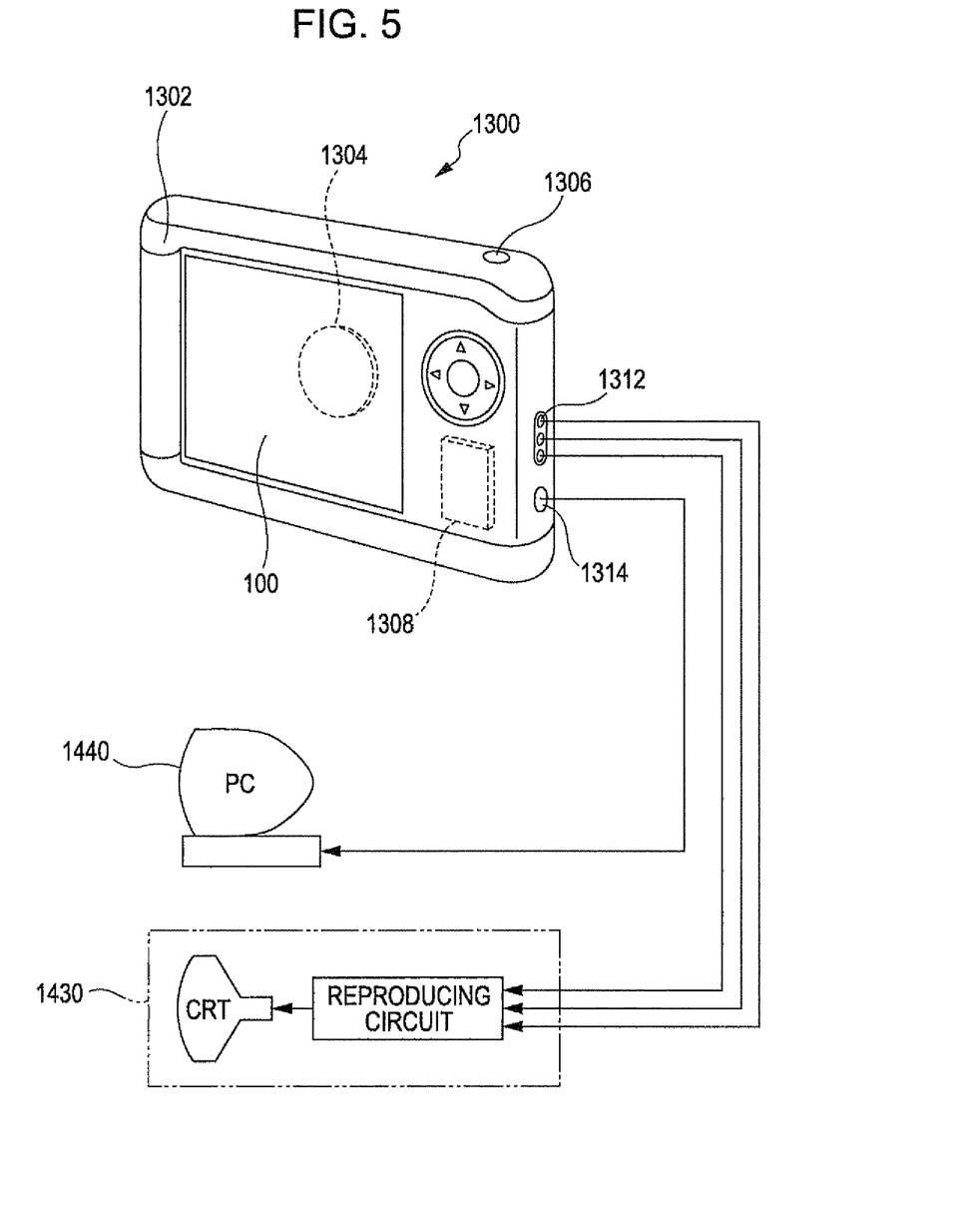
FIG. 5 is a perspective view that illustrates a structure of a digital still camera as an embodiment of an electronic apparatus according to an aspect of the invention.

FIG. 5 is a perspective view that illustrates a structure of a digital still camera as an embodiment of an electronic apparatus according to an aspect of the invention. The figure includes a brief illustration of connections to external devices.

While a usual camera produces an image by exposing a silver-halide photographic film to a light figure of a subject, a digital still camera 1300 photoelectrically converts a light figure of a subject by means of an imaging device such as CCD (charge coupled device) into imaging signals (picture signals).

A display section is provided on the backside of a case (a body) 1302 of the digital still camera 1300. The display section is configured to show an image based on the imaging signals from the CCD. That is, it functions as a viewfinder that displays a subject as an electronic image.

In this digital still camera 1300, the display section is constituted by the display 100 described above.

The case accommodates a circuit board 1308. The circuit board 1308 has a memory for storing (memorizing) the imaging signals.

A light-receiving unit 1304 including an optical lens (an imaging optical system) and CCD is provided on the front side (the back in the figure) of the case 1302.

When a user recognizes a subject image displayed on the display section and presses a shutter button 1306, the CCD transfers the imaging signals at the moment of shooting to the memory of the circuit board 1308 and the imaging signals are stored in the memory.

In this digital still camera 1300, a video signal output terminal 1312 and a data communication input/output terminal 1314 are provided on a side of the case 1302. As illustrated, a television monitor 1430 and a personal computer 1440 can be connected as required to the video signal output terminal 1312 and the data communication input/output terminal 1314, respectively. The digital still camera is configured such that the imaging signals stored in the memory of the circuit board 1308 can be output to the television monitor 1430 or the personal computer 1440 by conducting appropriate operations.

The electronic apparatuses according to some aspects of the invention are not limited to the personal computer (the mobile personal computer) illustrated in FIG. 3, the cellular phone illustrated in FIG. 4, and the digital still camera illustrated in FIG. 5. For example, the inventive display devices are also applicable to other electronic apparatuses including television sets, video cameras, viewfinder video tape recorders, monitor direct view video tape recorders, laptop personal computers, car navigation systems, pagers, electronic notebooks (including electronic notebooks with communication functions), electronic dictionaries, electronic calculators, electronic game machines, word processors, work stations, videophone systems, security television monitors, electronic binoculars, POS terminals, machines having a touch panel (for example, cash dispensers at financial institutions, and automatic ticket vending machines), medical apparatuses (for example, electronic thermometers, sphygmomanometers, blood glucose meters, electrocardiographic monitors, ultrasound diagnostic systems, and endoscopic display apparatuses), fish-finding devices, various measuring devices, meters (for example, automotive meters, aircraft meters, and ship meters), flight simulators, various monitors, and projecting display apparatuses such as projectors.

The aforementioned embodiments of the light-emitting devices, the light-emitting apparatuses, the display devices and the electronic apparatuses that have been described with reference to the drawings are only explanatory and do not limit the scope of the invention.

For example, although the light-emitting device has been described as having three light-emitting layers, the scope of the invention is not limited to such configurations and the light-emitting device may have two light-emitting layers or may have four or more light-emitting layers. In such cases, the configuration or the structure is not particularly limited as long as at least one phosphorescent layer and at least one fluorescent layer are provided on the anode side and the cathode side of the intermediate layer.

Further, although the emitting sections (emitting units) in the aforementioned light-emitting device have been described as having non-emitting layers (for example, the hole transport layer and the electron transport layer) other than the emitting layers, the scope of the invention is not limited to such configurations as long as each of the emitting sections has at least one emitting layer. Namely, it is also an embodiment of the invention to constitute the emitting sections with the emitting layers alone.

EXAMPLES

Examples according to the invention will be described below.

1. Production of Light-Emitting Devices

Example 1

1. First, a transparent glass substrate having an average thickness of 0.5 mm was provided. An ITO electrode (an anode) was sputtered to an average thickness of 50 nm on the substrate.

The substrate with the anode was then ultrasonically cleaned sequentially in acetone and 2-propanol in this order, and was thereafter subjected to oxygen plasma treatment.

2. Next, 4,4',4''-tris(N-carbazolyl)-triphenylamine (TCTA) was deposited on the ITO electrode by a vacuum deposition method to form a hole transport layer (a hole transport layer in a first emitting section) having an average thickness of 50 nm.

3. Subsequently, a second phosphorescent layer (a red phosphorescent layer) with an average thickness of 5 nm was formed on the hole transport layer by a vacuum deposition method.

The material used herein to form the second phosphorescent layer was a mixture material containing btp2Ir(acac) as a red phosphorescent material (a guest material) and CBP as a host material. The content (the dosage) of the red phosphorescent material in the second phosphorescent layer was 5.0 wt %.

4. Next, a first phosphorescent layer (a green phosphorescent layer) with an average thickness of 10 nm was formed on the second phosphorescent layer by a vacuum deposition method.

The material used herein to form the first phosphorescent layer was a mixture material containing $Ir(ppy)_3$ as a green phosphorescent material (a guest material) and CBP as a host material. The content (the dosage) of the green phosphorescent material in the first phosphorescent layer was 10.0 wt %.

5. Next, 2,9-dimethyl-4,7-diphenyl-1,10-phenanthroline (BCP) was deposited on the first phosphorescent layer by a vacuum deposition method to form an electron transport layer having an average thickness of 5 nm.

6. Next, 4,4',4''-tris(N-carbazolyl)-triphenylamine (TCTA) was deposited on the electron transport layer by a vacuum deposition method to form a hole transport layer having an average thickness of 5 nm.

The electron transport layer and the hole transport layer formed in the steps 5 and 6 constituted an intermediate layer.

7. Next, a fluorescent layer (a blue fluorescent layer) with an average thickness of 20 nm was formed on the hole transport layer by a vacuum deposition method.

The material used herein to form the fluorescent layer was a mixture material containing 4,4'-bis(9-ethyl-3-carbazovinylene)-1,1'-biphenyl (BCzVBi) as a blue fluorescent material (a guest material) and 4,4'-bis(2,2'-diphenylvinyl)biphenyl (DPVBi) as a host material. The content (the dosage) of the blue fluorescent material in the fluorescent layer was 3.0 wt %.

8. Next, 1,3-bis(N,N-t-butyl-phenyl)-1,3,4-oxadiazole (OXD-7) was deposited on the fluorescent layer by a vacuum deposition method to form an electron transport layer (an electron transport layer in a second emitting section) having an average thickness of 40 nm.

9. Next, lithium fluoride (LiF) was deposited on the electron transport layer by a vacuum deposition method to form an electron injection layer with an average thickness of 1.0 nm.

10. Next, aluminum was deposited on the electron injection layer by a vacuum deposition method to form an Al cathode layer having an average thickness of 100 nm.

11. Next, a protective glass cover (a sealing member) was placed so as to cover the formed layers, and an epoxy resin was applied to fix the sealing member and to seal the layers.

The steps described above resulted in a light-emitting device in which the anode, the hole transport layer, the second phosphorescent layer, the first phosphorescent layer, the intermediate layer (the electron transport layer and the hole transport layer), the fluorescent layer, the electron transport layer, the electron injection layer and the cathode were stacked on top of one another in this order on the substrate.

Example 2

A light-emitting device was produced in the same manner as in Example 1, except that the electron transport layer was formed in an average thickness of 3 nm in the step 5, and that the hole transport layer was formed in an average thickness of 7 nm in the step 6.

Example 3

A light-emitting device was produced in the same manner as in Example 1, except that the electron transport layer was formed in an average thickness of 7 nm in the step 5, and that the hole transport layer was formed in an average thickness of 3 nm in the step 6.

Example 4

A light-emitting device was produced in the same manner as in Example 1, except that the electron transport layer was formed in an average thickness of 1 nm in the step 5, and that the hole transport layer was formed in an average thickness of 11 nm in the step 6.

Example 5

A light-emitting device was produced in the same manner as in Example 1, except that the electron transport layer was formed in an average thickness of 11 nm in the step 5, and that the hole transport layer was formed in an average thickness of 1 nm in the step 6.

Comparative Example 1

A light-emitting device was produced in the same manner as in Example 1, except that the step 5 of forming the electron transport layer was omitted, and that the hole transport layer was formed in a thickness of 10 nm in the step 6.

Comparative Example 2

A light-emitting device was produced in the same manner as in Example 1, except that the step 6 of forming the hole transport layer was omitted, and that the electron transport layer was formed in a thickness of 10 nm in the step 5.

Comparative Example 3

A light-emitting device was produced in the same manner as in Example 1, except that the step 5 and the step 6 were reversed, namely, the intermediate layer was formed such that the electron transport layer was on the cathode side and the hole transport layer was on the anode side.

Comparative Example 4

A light-emitting device was produced in the same manner as in Example 1, except that the step 5 and the step 6 were replaced by the step 5' described below, namely, the intermediate layer contained both the hole transport material and the electron transport material.

5'. BCP and TCTA were deposited on the first phosphorescent layer by a vacuum deposition method to form an intermediate layer in an average thickness of 10 nm that contained both the hole transport material and the electron transport material.

2. Evaluations

In Examples and Comparative Examples, a constant current of 100 mA/cm² was applied to the light-emitting device using a DC power supply, and the chromaticity (x, y) of the emitted light was measured with a colorimeter.

Further, the light-emitting device in each of Examples and Comparative Examples was caused to emit light by passing a current between the anode and the cathode at a current density of 10 mA/cm² using a DC power supply. The drive voltage applied to the light-emitting device and the current efficiency of the device in emitting light were measured. The drive voltage and the current efficiency obtained in Comparative Example 1 were used as the references, and the obtained data was normalized.

The results are described in Table 1.

TABLE 1

| | Electron transport layer | | Hole transport layer | | Position of | Chromaticity (CIE color system) | | Relative current | Relative drive |
|---|---|---|---|---|---|---|---|---|---|
| | Electron transport material | Layer thickness [nm] | Hole transport material | Layer thickness [nm] | electron transport layer | x | y | efficiency | voltage |
| Ex. 1 | BCP | 5.0 | TCTA | 5.0 | Anode side | 0.37 | 0.41 | 1.38 | 0.91 |
| Ex. 2 | BCP | 3.0 | TCTA | 7.0 | Anode side | 0.35 | 0.31 | 1.29 | 0.92 |
| Ex. 3 | BCP | 7.0 | TCTA | 3.0 | Anode side | 0.43 | 0.44 | 1.28 | 0.89 |
| Ex. 4 | BCP | 1.0 | TCTA | 11.0 | Anode side | 0.25 | 0.32 | 0.95 | 1.03 |
| Ex. 5 | BCP | 11.0 | TCTA | 1.0 | Anode side | 0.51 | 0.42 | 1.52 | 1.16 |
| Comp. Ex. 1 | — | — | TCTA | 10.0 | — | 0.22 | 0.30 | 1.00 | 1.00 |
| Comp. Ex. 2 | BCP | 10.0 | — | — | — | 0.47 | 0.47 | 1.74 | 0.93 |
| Comp. Ex. 3 | BCP | 5.0 | TCTA | 5.0 | Cathode side | 0.35 | 0.50 | 0.98 | 0.85 |
| Comp. Ex. 4 | BCP/TCTA mixture layer | | | 10.0 | — | 0.40 | 0.44 | 0.92 | 0.95 |

The results in Table 1 show that the light-emitting devices obtained in Examples achieved excellent current efficiency while suppressing an increase in the drive voltage compared to the light-emitting devices in Comparative Examples.

Further, the light-emitting devices obtained in Examples were found to emit whiter light than the light emitted by the light-emitting devices in Comparative Examples. This result confirmed that the red and green phosphorescent layers and the blue fluorescent layer in the light-emitting devices obtained in Examples emitted the lights efficiently.

This application claims priority from Japanese Patent Application No. 2011-052126 filed in the Japanese patent office on Mar. 9, 2011, the entire disclosure of which is hereby incorporated by reference in its entirely.

What is claimed is:

1. A light-emitting device comprising:
   an anode;
   a cathode;
   a phosphorescent layer and a fluorescent layer that are provided between the anode and the cathode and emit phosphorescent light and fluorescent light, respectively, upon energization of the anode and the cathode;
   an intermediate layer provided between the phosphorescent layer and the fluorescent layer;
   an electron transport layer provided between the fluorescent layer and the cathode;
   a hole blocking layer provided between the fluorescent layer and the electron transport layer;
   the intermediate layer includes a hole transport layer and an electron transport layer that are in contact with each other, the electron transport layer of the intermediate layer being located on the anode side, the hole transport layer of the intermediate layer being located on the cathode side, the intermediate layer suppressing transfer of triplet energy of the phosphorescent layer toward the fluorescent layer, and the intermediate layer permitting smooth transport of electrons and holes,
   wherein the intermediate layer does not emit light upon energization of the anode and the cathode and the light-emitting device having an increased relative current efficiency between 0.95 to 1.52 while suppresses an increase in drive voltage for the light-emitting device.

2. The light-emitting device according to claim 1, wherein the phosphorescent layer is located between the anode and the intermediate layer, and the fluorescent layer is located between the cathode and the intermediate layer.

3. The light-emitting device according to claim 1, wherein the triplet energies of both the hole transport layer and the electron transport layer of the intermediate layer are larger than the triplet energy of the phosphorescent layer.

4. The light-emitting device according to claim 1, wherein the hole transport of the intermediate layer has an average thickness of not less than 2 nm and not more than 10 nm.

5. The light-emitting device according to claim 1, wherein the electron transport layer of the intermediate layer has an average thickness of not less than 2 nm and not more than 10 rim.

6. The light-emitting device according to claim 1, wherein the total of the thickness of the hole transport layer and that of the electron transport layer of the intermediate layer is not more than 15 nm.

7. The light-emitting device according to claim 1, wherein the light-emitting device has a second phosphorescent layer that is provided between the anode and the phosphorescent layer and emits phosphorescent light upon energization between the anode and the cathode.

8. A light-emitting apparatus comprising the light-emitting device described in claim 1.

9. A display device comprising the light-emitting apparatus described in claim 8.

10. An electronic apparatus comprising the display device described in claim 9.

11. A light-emitting device comprising:
    an anode;
    a cathode;
    a phosphorescent layer and a plurality of fluorescent layers that are provided between the anode and the cathode and emit phosphorescent light and fluorescent light, respectively, upon energization of the anode and the cathode;
    a first intermediate layer provided between the phosphorescent layer and the plurality of fluorescent layers;
    a second intermediate layer provided between the plurality of fluorescent layers;
    an electron transport layer provided between the plurality of fluorescent layers and the cathode;
    a hole blocking layer provided between the plurality of fluorescent layers and the electron transport layer;
    the first intermediate layer includes a hole transport layer and an electron transport layer that are in contact with each other, the electron transport layer of the first intermediate layer being located on the anode side, the hole transport layer of the first intermediate layer being located on the cathode side, the first intermediate layer suppressing transfer of triplet energy of the phosphorescent layer toward the plurality of fluorescent layers, and the first intermediate layer permitting smooth transport of electrons and holes,
    wherein the intermediate layers do not emit light upon energization of the anode and the cathode and the light-emitting device having an increased relative current efficiency between 0.95 to 1.52 while suppresses an increase in drive voltage for the light-emitting device.

* * * * *